(12) United States Patent
Matsushita

(10) Patent No.: US 9,508,809 B2
(45) Date of Patent: Nov. 29, 2016

(54) III-N DEVICE WITH EXTENDED SOURCE AND DRAIN

(71) Applicant: Kabushiki Kaisha Toshiba, Minato-ku (JP)

(72) Inventor: Keiichi Matsushita, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/792,107

(22) Filed: Jul. 6, 2015

(65) Prior Publication Data

US 2016/0071939 A1    Mar. 10, 2016

(30) Foreign Application Priority Data

Sep. 9, 2014    (JP) ................. 2014-183586

(51) Int. Cl.
| | |
|---|---|
| *H01L 29/417* | (2006.01) |
| *H01L 29/66* | (2006.01) |
| *H01L 29/778* | (2006.01) |
| *H01L 29/20* | (2006.01) |

(52) U.S. Cl.
CPC ... *H01L 29/41766* (2013.01); *H01L 29/66462* (2013.01); *H01L 29/7786* (2013.01); *H01L 29/2003* (2013.01)

(58) Field of Classification Search
CPC .............. H01L 29/41766; H01L 29/0692; H01L 29/7783
See application file for complete search history.

(56) References Cited

U.S. PATENT DOCUMENTS

| | | | | |
|---|---|---|---|---|
| 5,319,223 A | * | 6/1994 | Fujita | ............ H01L 29/7783 257/190 |
| 2006/0273382 A1 | * | 12/2006 | Hshieh | ............ H01L 24/26 257/330 |

(Continued)

FOREIGN PATENT DOCUMENTS

| | | |
|---|---|---|
| JP | 9-64341 A | 3/1997 |
| JP | 2007-158149 A | 6/2007 |

(Continued)

OTHER PUBLICATIONS

Extended European Search Report issued Feb. 9, 2016 in Patent Application No. 15175915.6.

*Primary Examiner* — Asok K Sarkar
*Assistant Examiner* — Grant Withers
(74) *Attorney, Agent, or Firm* — Oblon, McClelland, Maier & Neustadt, L.L.P.

(57) ABSTRACT

A semiconductor device includes a substrate, a semiconductor layer having a buffer layer, a spacer layer, and barrier layer sequentially stacked on the substrate, and first and second ohmic electrodes installed on an upper surface of the barrier layer in the substrate to be separated from each other. Each of the first and second ohmic electrodes includes a portion formed on the upper surface of the barrier layer and electrode portions filling a plurality of grooves penetrating from the upper surface of the barrier layer through the barrier layer and the spacer layer and reaching a region of a two-dimensional electron gas layer formed in a spacer-layer side of the buffer layer, the electrode portions being in contact with side walls of each of the plurality of the grooves, and the portion formed on the upper surface of the barrier layer and the electrode portions are integrally formed.

2 Claims, 8 Drawing Sheets

(56) References Cited

U.S. PATENT DOCUMENTS

| | | | | |
|---|---|---|---|---|
| 2007/0132037 A1* | 6/2007 | Hoshi | H01L 21/28587 | 257/396 |
| 2007/0187717 A1* | 8/2007 | Sadaka | H01L 29/1029 | 257/192 |
| 2009/0189188 A1* | 7/2009 | Matsushita | H01L 29/1029 | 257/192 |
| 2010/0059815 A1* | 3/2010 | Grivna | H01L 21/76232 | 257/330 |
| 2011/0260216 A1* | 10/2011 | Hebert | H01L 21/8258 | 257/194 |
| 2012/0043591 A1* | 2/2012 | Takada | H01L 23/291 | 257/288 |
| 2012/0248500 A1* | 10/2012 | Kajitani | H01L 29/045 | 257/183 |
| 2012/0280210 A1* | 11/2012 | Pillarisetty | H01L 29/772 | 257/24 |
| 2013/0015498 A1* | 1/2013 | Briere | H01L 29/868 | 257/191 |
| 2013/0015499 A1* | 1/2013 | Briere | H01L 29/41766 | 257/191 |
| 2014/0264379 A1* | 9/2014 | Kub | H01L 29/41725 | 257/77 |

FOREIGN PATENT DOCUMENTS

| | | |
|---|---|---|
| JP | 2007-165446 A | 6/2007 |
| JP | 2007-227409 A | 9/2007 |
| JP | 2008-72083 A | 3/2008 |
| JP | 2011-129769 A | 6/2011 |

* cited by examiner

III-N DEVICE WITH EXTENDED SOURCE AND DRAIN

CROSS-REFERENCE TO RELATED APPLICATION

This application is based upon and claims the benefit of priority from the prior Japanese Patent Application No. 2014-183586, filed on Sep. 9, 2014, the entire contents of which are incorporated herein by reference.

FIELD

Embodiments of the present invention relate to a semiconductor device.

DESCRIPTION OF THE RELATED ART

In the related art, as one of semiconductor devices, there is known an HEMT (High Electron Mobility Transistor) made of a nitride-based compound. As illustrated in a cross-sectional diagram of FIG. 8A, in this type of semiconductor device, for example, a buffer layer 82 made of gallium nitride (GaN) and a barrier layer 84 made of aluminum gallium nitride (AlGaN) are sequentially stacked on a substrate 81 made of sapphire or the like, and drain and source electrodes 85 and 86 and a gate electrode 87 interposed between the two electrodes 85 and 86 are formed on the upper surface of the barrier layer.

A metal for ohmic is directly stacked on the barrier layer 84 through vapor deposition, and after that, an alloy is formed from the metal for ohmic and a portion of the barrier layer 84 being in contact with the metal at high temperature, so that each electrode is formed as a low-resistance ohmic electrode. The drain electrode 85 and the source electrode 86 maintain a good contact with a two-dimensional electron gas layer 82a formed in the vicinity of the upper surface of the buffer layer 82 through the barrier layer 84.

In an example of FIG. 8B, a spacer layer 83 made of, for example, aluminum nitride (AlN) is formed between the buffer layer 82 and the barrier layer 84. If the spacer layer 83 is formed on the upper surface of the buffer layer 82, electron mobility of the two-dimensional electron gas layer 82a immediately below the spacer layer 83 is increased. The spacer layer 83 is used as one method of improving high-frequency characteristics.

The spacer layer 83 made of AlN has a large band gap. Therefore, the spacer layer 83 becomes a barrier, and thus, there is a problem in that the drain electrode 85 and the source electrode 86 cannot maintain a good contact with the two-dimensional electron gas layer 82a and ohmic resistance of the electrodes is increased. Reduction in ohmic resistance of these electrodes has been desired.

DETAILED DESCRIPTION

According to an embodiment of the invention, there is provided a semiconductor device including a substrate, a semiconductor layer having a buffer layer, a spacer layer, and barrier layer sequentially stacked on the substrate, and first and second ohmic electrodes installed on an upper surface of the barrier layer in the substrate to be separated from each other. Each of the first and second ohmic electrodes includes a portion formed on the upper surface of the barrier layer and electrode portions filling a plurality of grooves penetrating from the upper surface of the barrier layer through the barrier layer and the spacer layer and reaching a region of a two-dimensional electron gas layer formed in a spacer-layer side of the buffer layer, the electrode portions being in contact with side walls of each of the plurality of the grooves, and the portion formed on the upper surface of the barrier layer and the electrode portions are integrally formed.

According to the semiconductor device having the above-described configuration, it is possible to reduce ohmic resistance of the electrodes.

Hereinafter, semiconductor devices according to an embodiment will be described with reference to FIG. 1A to FIG. 7.

First Example

Figure 1A:
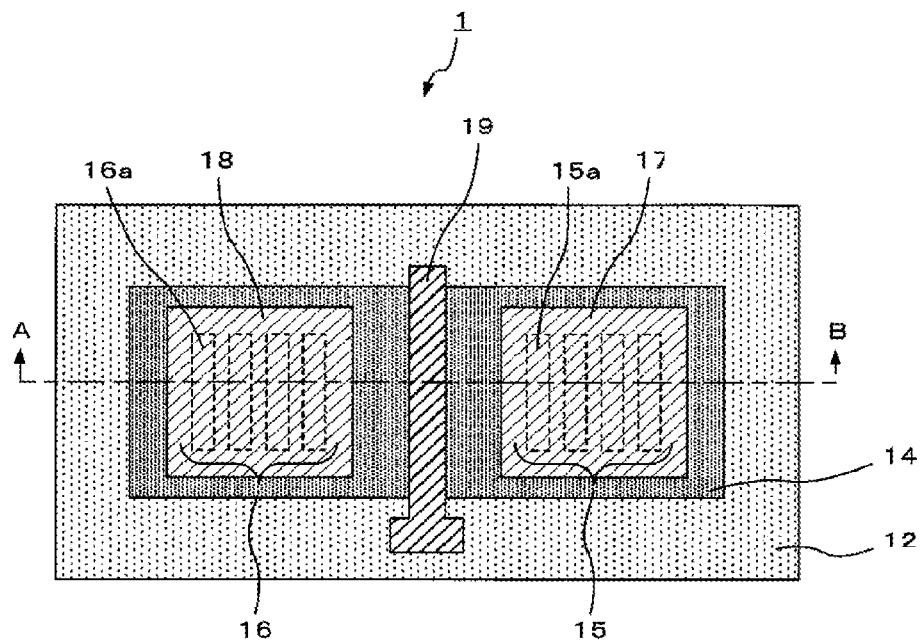
FIGS. 1A and 1B are diagrams illustrating a structure of a first example of a semiconductor device according to an embodiment.
Figure 1B:
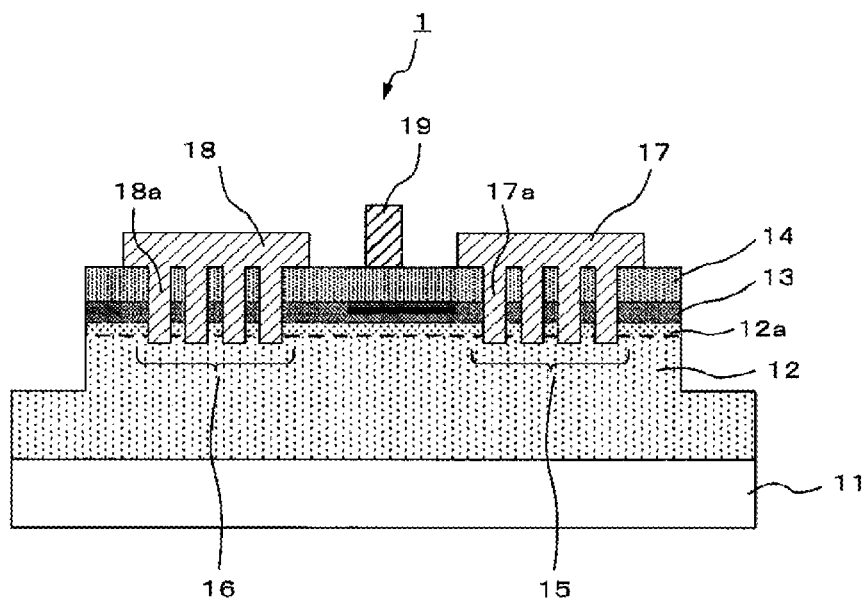

FIGS. 1A and 1B are diagrams illustrating a structure of a first example of a semiconductor device according to an embodiment. FIG. 1A is a plan diagram, and FIG. 1B is a cross-sectional diagram taken along line A-B of FIG. 1A.

A semiconductor device 1 has an HEMT structure made of a nitride-based compound. Namely, as described later in detail, the semiconductor device 1 includes a substrate 11 and a semiconductor layer formed on the substrate 11. The semiconductor layer includes a buffer layer 12, a spacer layer 13, and a barrier layer 14 which are sequentially stacked on the substrate 11. The buffer layer 12 includes a two-dimensional electron gas layer 12a in the vicinity of the upper surface thereof. The semiconductor device 1 includes drain and source electrodes 17 and 18 as two ohmic electrodes formed on the upper surface of the barrier layer 14 and a gate electrode 19 formed between the two electrodes. In the semiconductor layer immediately below these ohmic electrodes, a groove portion 15 having a plurality of grooves and a groove portion 16 having a plurality of grooves are formed so as to penetrate from the upper surface of the barrier layer 14 through the barrier layer 14 and the spacer layer 13 and to reach the two-dimensional electron gas layer 12a in the vicinity of the upper surface of the buffer layer 12. Each of the drain and source electrodes 17 and 18 has a portion on the barrier layer 14 and an electrode portion being in contact with side walls of the grooves to fill the grooves from the upper surface of the barrier layer 14, and the portion on the barrier layer 14 and the electrode portion are integrally formed. Hereinafter, detailed components will be described.

As illustrated in FIG. 1B, in the semiconductor device 1, as the semiconductor layers, the buffer layer 12, the spacer layer 13, and the barrier layer 14 are sequentially stacked on the substrate 11. The substrate 11 is a flat substrate made of, for example, sapphire, silicon carbide, or the like. The buffer layer 12 made of, for example, gallium nitride (GaN) is stacked on the substrate 11. The two-dimensional electron gas layer 12a is formed as a thin layer in the vicinity of the upper surface of the buffer layer 12.

The spacer layer 13 made of, for example, aluminum nitride (AlN) is stacked on the upper surface of the buffer layer 12. The spacer layer 13 increases electron mobility in the two-dimensional electron gas layer 12a in the vicinity of the upper surface of the buffer layer 12 immediately below the spacer layer. The barrier layer 14 made of, for example, aluminum gallium nitride (AlGaN) is stacked on the upper surface of the spacer layer 13.

On the upper surface of the barrier layer 14, the groove portions 15 and 16 corresponding to the drain and source electrodes 17 and 18 are formed in the portions corresponding to the immediately-underlying regions where the drain and source electrodes 17 and 18 are to be formed. A plurality of grooves 15a are formed in the groove portion 15, and a plurality of grooves 16a are formed in the groove portion 16. Each groove 15a is dug to penetrate from the upper surface of the barrier layer 14 through the barrier layer 14 and the spacer layer 13 and to reach the two-dimensional electron gas layer 12a in the vicinity of the upper surface of the buffer layer 12, and the two-dimensional electron gas layer 12a is exposed in a lower end of a side wall of the groove. Each of grooves 16a is dug to penetrate from the upper surface of the barrier layer 14 through the barrier layer 14 and the spacer layer 13 and to reach the two-dimensional electron gas layer 12a in the vicinity of the upper surface of the buffer layer 12, and the two-dimensional electron gas layer 12a is exposed in the lower end of a side wall of the groove.

In the embodiment, as illustrated in FIG. 1A, the groove portion 15 includes four grooves 15a, the shape of the opening of each groove 15a is rectangular, and the four grooves 15a are arranged in a direction perpendicular to the longitudinal direction of the groove. In addition, as illustrated in FIG. 1A, the groove portion 16 includes four grooves 16a, the shape of the opening of each groove 16a is rectangular, and the four grooves 16a are arranged in the direction perpendicular to the longitudinal direction of the groove. The arrangement direction of the plurality of grooves is the direction perpendicular to the width direction of each electrode in the semiconductor device 1.

The drain electrode 17 and the source electrode 18 are formed on the upper surface of the barrier layer 14 immediately above the above-described groove portion 15 and the above-described groove portion 16, respectively. The two electrodes may be formed similarly by using a material of, for example, titanium aluminum or the like. The drain electrode 17 includes the portion formed on the barrier layer 14 and the electrode portions 17a fills the four grooves 15a which are arranged in the groove portion 15 from the upper surface of the barrier layer 14 and is in contact with the side walls of the grooves, and the portion on the barrier layer 14 and the electrode portions 17a are integrally formed. The source electrode 18 includes the portion formed on the barrier layer 14 and the electrode portions 18a fills the four grooves 16a which are arranged in the groove portion 16 from the upper surface of the barrier layer 14 and is in contact with the side walls of the grooves, and the portion on the barrier layer 14 and the electrode portions 18a are integrally formed.

In this manner, in the drain electrode 17, the electrode portions 17a buried in the respective grooves 15a are in direct contact with the two-dimensional electron gas layer 12a. Since the electrode portion 17a is in contact with the two-dimensional electron gas layer 12a in the entire circumference of the groove 15a, the contact area therebetween can be enlarged. Therefore, the drain electrode 17 can maintain a good contact with the two-dimensional electron gas layer 12a. In the source electrode 18, the electrode portions 18a buried in the respective grooves 16a are in direct contact with the two-dimensional electron gas layer 12a. Since the electrode portion 18a is in contact with the two-dimensional electron gas layer 12a in the entire circumference of the groove 16a, the contact area therebetween can be enlarged. Therefore, the source electrode 18 can maintain a good contact with the two-dimensional electron gas layer 12a. In addition, the gate electrode 19 is formed between the drain electrode 17 and the source electrode 18.

Next, a structure of the semiconductor device 1 will be described in detail along a manufacturing process for the semiconductor device 1 with reference to FIGS. 1A and 1B described above, FIGS. 2A to 2C, and FIGS. 3A and 3B. FIGS. 2A to 2C and FIGS. 3A and 3B are diagrams for explaining a cross-sectional structure of the semiconductor device 1 along an example of the manufacturing process for the semiconductor device 1.

Figure 2A:
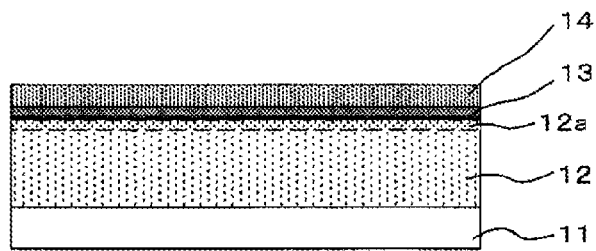
FIGS. 2A to 2C are first diagrams illustrating an example of a manufacturing process for the semiconductor device illustrated in FIGS. 1A and 1B.
Figure 2B:
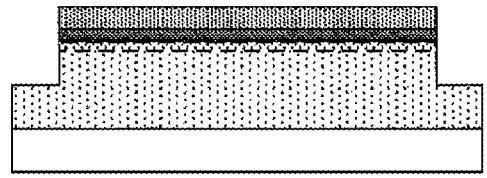

First, as illustrated in FIG. 2A, a wafer is formed where the buffer layer 12, the spacer layer 13, and the barrier layer 14 are sequentially stacked on the substrate 11. Next, in the both end portions of the wafer, the barrier layer 14, the spacer layer 13, the two-dimensional electron gas layer 12a, and the upper portion of the buffer layer 12 are cut off by using reactive ion etching (RIE) so that the lower portion of the buffer layer 12 remains. Therefore, the wafer is processed to have a cross-sectional shape illustrated in FIG. 2B.

Figure 2C:
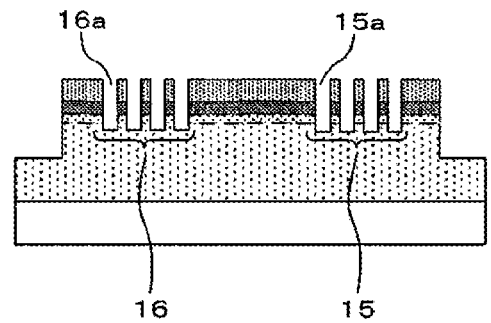

Next, as illustrated in FIG. 2C, in the region where the drain electrode 17 as an ohmic electrode is to be formed, the groove portion 15 is formed to include the four grooves 15a which penetrate from the upper surface of the barrier layer 14 through the barrier layer 14 and the spacer layer 13 and reach the region of the two-dimensional electron gas layer 12a. In the region where the source electrode 18 as an ohmic electrode is to be formed, the groove portion 16 is formed to include the four grooves 16a which penetrate from the upper surface of the barrier layer 14 through the barrier layer 14 and the spacer layer 13 and reach the region of the two-dimensional electron gas layer 12a. With respect to the groove portion 15, as illustrated in FIG. 1A, the shape of the opening of each groove 15a is rectangular, and a plurality of the grooves 15a are arranged in the direction perpendicular to the longitudinal direction of the groove. With respect to the groove portion 16, as illustrated in FIG. 1A, the shape of the opening of each groove 16a is rectangular, and a plurality of the grooves 16a are arranged in the direction perpendicular to the longitudinal direction of the groove. These grooves may be formed, for example, by forming a mask using photoresist, digging the grooves through etching such as RIE, and removing the mask.

Figure 3A:
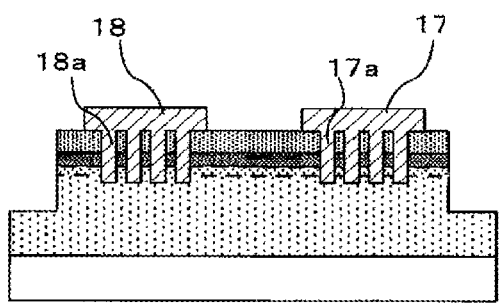
FIGS. 3A and 3B are second diagrams illustrating an example of a manufacturing process for the semiconductor device illustrated in FIGS. 1A and 1B.

Next, as illustrated in FIG. 3A, the drain electrode 17 and the source electrode 18 are formed. The drain electrode 17 is formed from the upper surface of the barrier layer 14 so that the electrode portions fill the grooves 15a of the groove portion 15 to be in contact with the side walls of the grooves 15a. The source electrode 18 is formed from the upper surface of the barrier layer 14 so that the electrode portions fill the grooves 16a of the groove portion 16 to be in contact with the side walls of the grooves 16a. For example, titanium aluminum or like is vapor-deposited on the upper surface of the barrier layer 14, the insides of the grooves 15a, and the insides of the grooves 16a, and an alloy of the deposited titanium aluminum or the like and the semiconductor layer is formed. Therefore, in the drain electrode 17, the electrode portions 17a inside the grooves 15a and the portion stacked on the barrier layer 14 are integrally formed. In the source electrode 18, the electrode portions 18a inside the grooves 16a and the portion stacked on the barrier layer 14 are integrally formed.

Figure 3B:
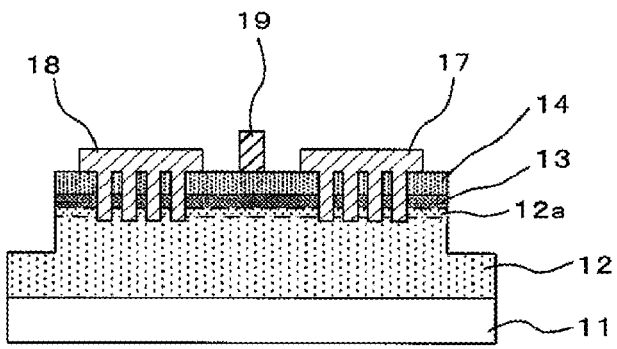

Next, as illustrated in FIG. 3B, the gate electrode 19 is formed between the drain electrode 17 and the source electrode 18. As a result, the semiconductor device 1 having an HEMT structure is formed.

As described heretofore, the semiconductor device 1 according to the example includes the groove portion 15 including a plurality of the grooves 15a which are arranged to penetrate from the upper surface of the barrier layer 14 through the barrier layer 14 and the spacer layer 13 and to reach the two-dimensional electron gas layer 12a in the vicinity of the upper surface of the buffer layer 12 in the region where the drain electrode 17 as an ohmic electrode is to be formed. The semiconductor device 1 according to the example includes the groove portion 16 including a plurality of the grooves 16a which are arranged to penetrate from the upper surface of the barrier layer 14 through the barrier layer 14 and the spacer layer 13 and to reach the two-dimensional electron gas layer 12a in the vicinity of the upper surface of the buffer layer 12 in the region where the source electrode 18 as an ohmic electrode is to be formed. In the drain electrode 17, the electrode portions 17a filling the grooves 15a and being in contact with the side walls of the grooves 15a and the portion stacked on the barrier layer 14 are integrally formed. In the source electrode 18, the electrode portions 18a filling the grooves 16a and being in contact with the side walls of the grooves 16a and the portion stacked on the barrier layer 14 are integrally formed. Therefore, each electrode can be in direct contact with the two-dimensional electron gas layer 12a and maintain a good contact with the two-dimensional electron gas layer. Since the electrode portion 17a formed inside each groove 15a is in contact with the two-dimensional electron gas layer 12a in the entire circumference of the groove 15a, the drain electrode 17 and the two-dimensional electron gas layer 12a can secure a sufficient contact area. Since the electrode portion 18a formed inside each groove 16a is in contact with the two-dimensional electron gas layer 12a in the entire circumference of the groove 16a, the source electrode 18 and the two-dimensional electron gas layer 12a can secure a sufficient contact area. Therefore, it is possible to obtain a semiconductor device having an HEMT structure where ohmic resistance of the electrodes is reduced.

Second Example

Figure 4A:
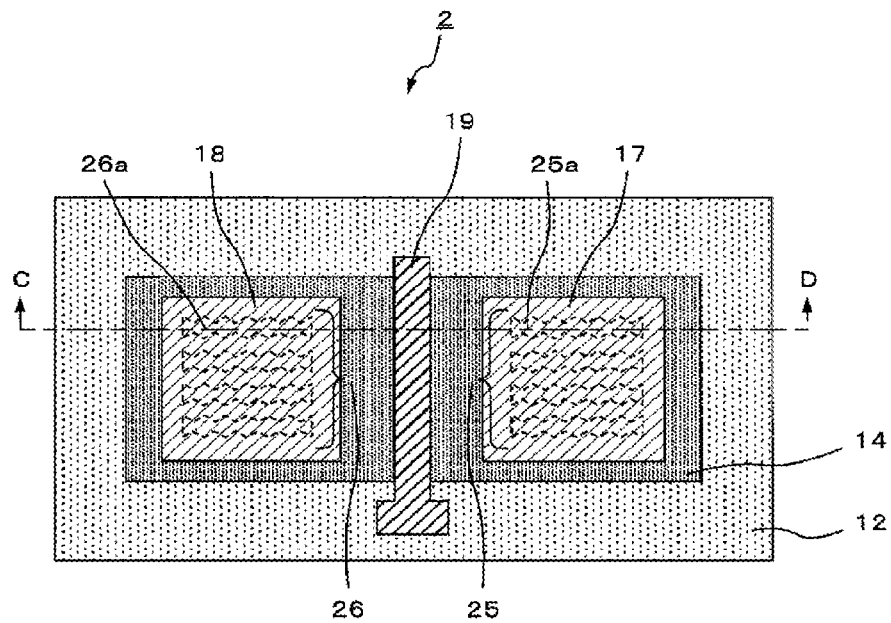
FIGS. 4A and 4B are diagrams illustrating a structure of a second example of the semiconductor device according to the embodiment.
Figure 4B:
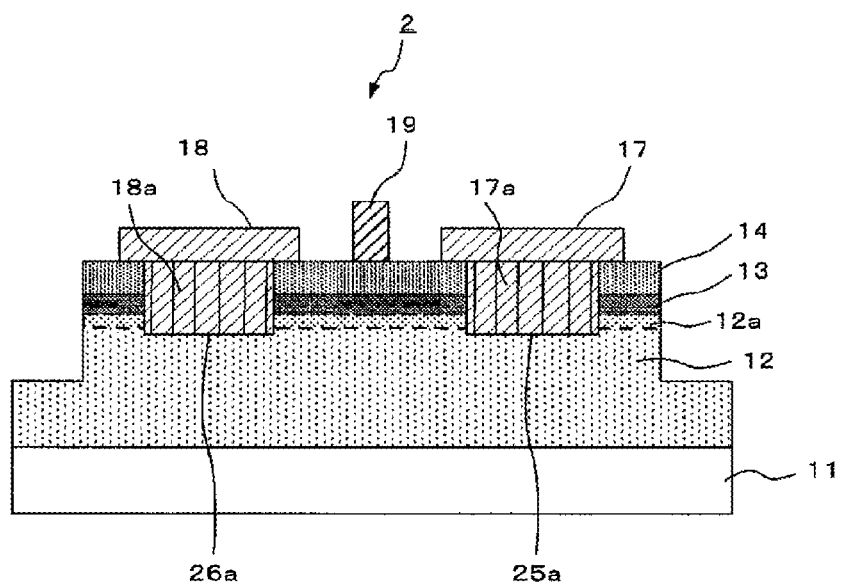

FIGS. 4A and 4B are diagrams illustrating a structure of a second example of the semiconductor device according to the embodiment. FIG. 4A is a plan diagram, and FIG. 4B is a cross-sectional diagram taken along line C-D of FIG. 4A. In the second example, the same components and portions as those of the first example illustrated in FIGS. 1A to 3B are denoted by the same reference numerals as those of the first example, and the detailed description thereof are omitted. The second example is different from the first example in terms of the following points. In the first example, the shape of the opening of each groove 15a of the groove portion 15 where the electrode portion 17a of the drain electrode 17 as an ohmic electrode is buried and the shape of the opening of each groove 16a of the groove portion 16 where the electrode portion 18a of the source electrode 18 as an ohmic electrode is buried are formed to be rectangular. In contrast, in the second example, the long sides of the rectangular opening of each groove are formed in a sawteeth shape. Hereinafter, different points will be mainly described with reference to FIGS. 1A to 3B, FIGS. 4A and 4B, and FIG. 5.

As illustrated in FIGS. 4A and 4B, a semiconductor device 2 also has an HEMT structure made of a nitride-based compound. A buffer layer 12, a spacer layer 13, and barrier layer 14 are sequentially stacked on the substrate 11, and a drain electrode 17 and a source electrode 18 are formed on the upper surface of the barrier layer 14. Immediately below the drain electrode 17, a groove portion 25 is formed to include a plurality of grooves reaching a two-dimensional electron gas layer 12a from the barrier layer 14. Immediately below the source electrode 18, a groove portion 26 is formed to include a plurality of grooves reaching the two-dimensional electron gas layer 12a from the barrier layer 14. In the drain electrode 17, electrode portions 17a filling the grooves and being in contact with the sides walls of the grooves are formed. In the source electrode 18, electrode portions 18a filling the grooves and being in contact with the side walls of the grooves are formed.

Figure 5:
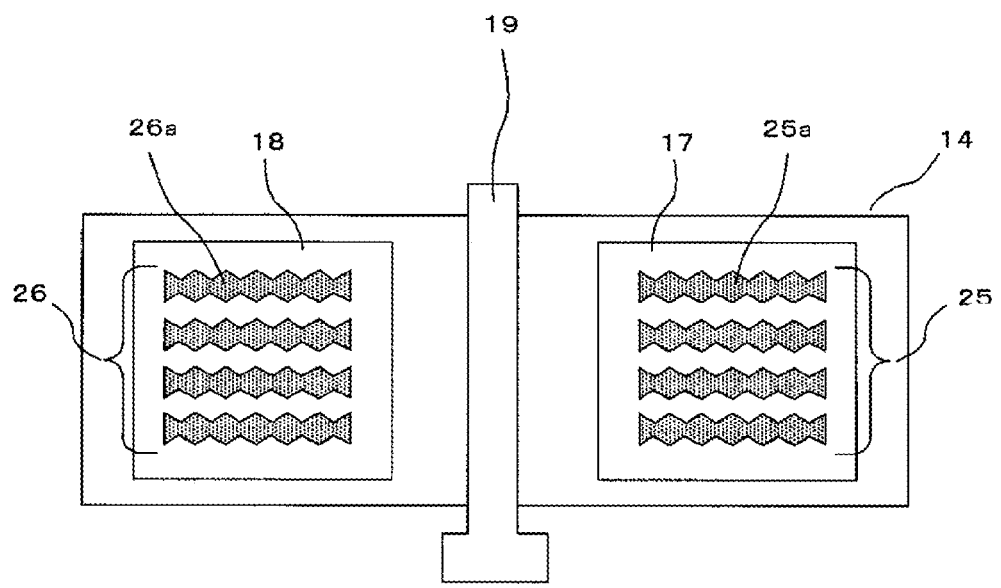
FIG. 5 is a diagram illustrating an example of shapes of groove portions of the semiconductor device illustrated in FIGS. 4A and 4B.

The shapes of the groove portions 25 and 26 according to the example are illustrated in FIG. 5. In FIG. 5, the portions of the drain and source electrodes 17 and 18 on the barrier layer 14 are removed in illustration. FIG. 5 is a plan diagram illustrating the shapes of the openings of the grooves 25a and 26a exposed from the barrier layer 14. In the example, the groove portions 25 and 26 are formed in the same shape, and the grooves 25a and 26a have the shapes of the openings where the long sides of the rectangular openings are in a sawteeth shape. In each of the groove portions 25 and 26, a plurality (four) of grooves is arranged in the direction perpendicular to the sawteeth-shaped long sides. In addition, in the example, the direction of the arrangement of the plurality of the grooves is a width direction of the electrode of the semiconductor device 2.

In this manner, the long sides of each of the grooves 25a and 26a are formed in a sawteeth shape, so that circumferential lengths of the openings become long, and thus, the contact area between each electrode and the two-dimensional electron gas layer 12a can be further enlarged. Therefore, in the example, it is possible to further reduce the ohmic resistance of the electrodes in the semiconductor device having an HEMT structure.

Third Example

Figure 6A:
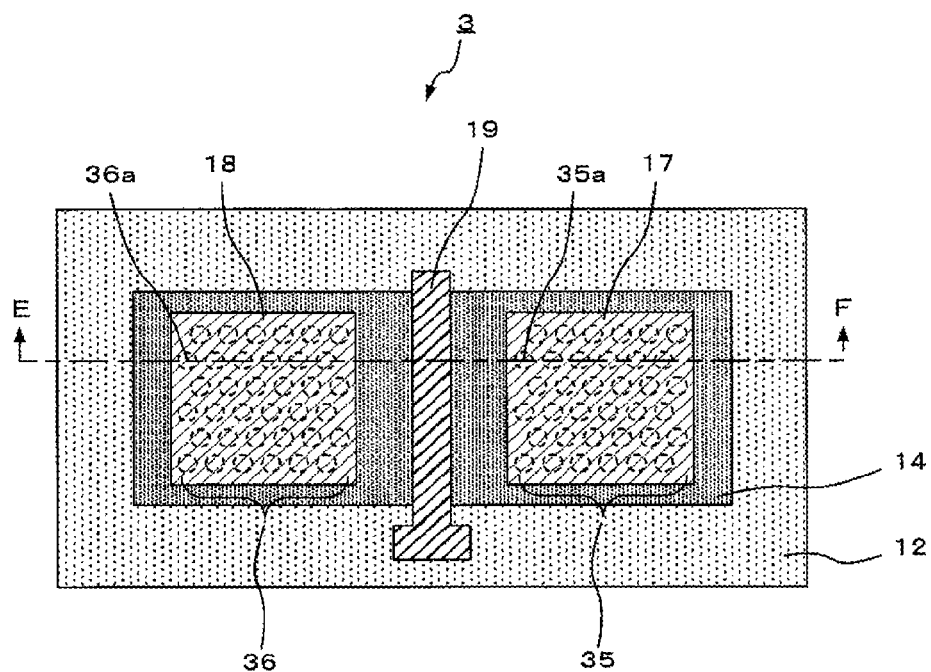
FIGS. 6A and 6B are diagrams illustrating a structure of a third example of the semiconductor device according to the embodiment.
Figure 6B:
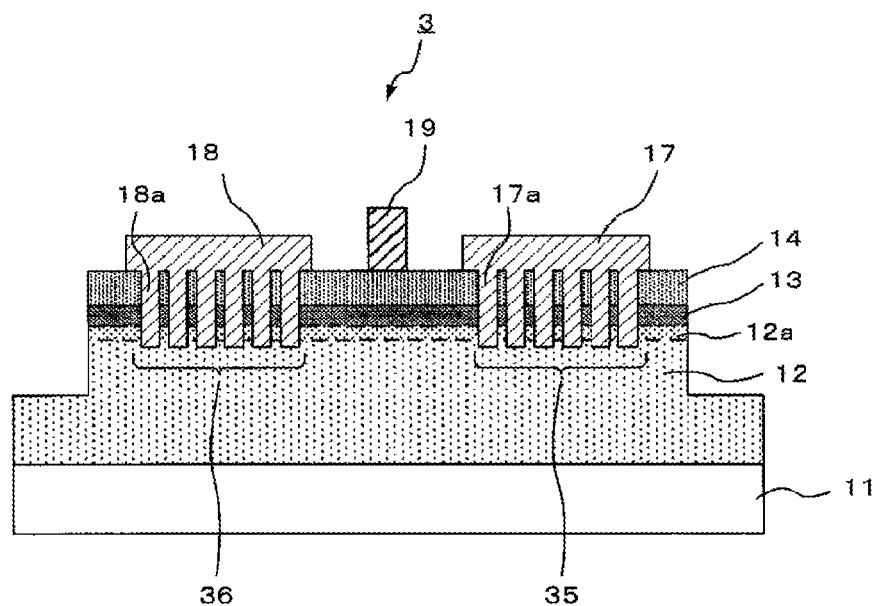

FIGS. 6A and 6B are diagrams illustrating a structure of a third example of the semiconductor device according to the embodiment. FIG. 6A is a plan diagram, and FIG. 6B is a cross-sectional diagram taken along line E-F of FIG. 6A. In the third example, the same components and portions as those of the first and second examples illustrated in FIGS. 1A to 5 are denoted by the same reference numerals as those of the first and second examples, and the detailed description thereof is omitted. In the third example, a groove portion 35 is configured so that the shapes of openings of grooves where electrode portions 17a of a drain electrode 17 are buried are formed to be circular, and a plurality of the circular grooves are arranged in the width direction of the electrode and the direction perpendicular to the width direction. A groove portion 36 is configured so that the shapes of openings of grooves where electrode portions 18a of a source electrode are buried are formed to be circular, and a plurality of circular grooves are arranged in the width direction of the electrode and the direction perpendicular to the width direction. Hereinafter, different points will be mainly described with reference to FIGS. 1A to 5, FIGS. 6A and 6B, and FIG. 7.

Figure 7:
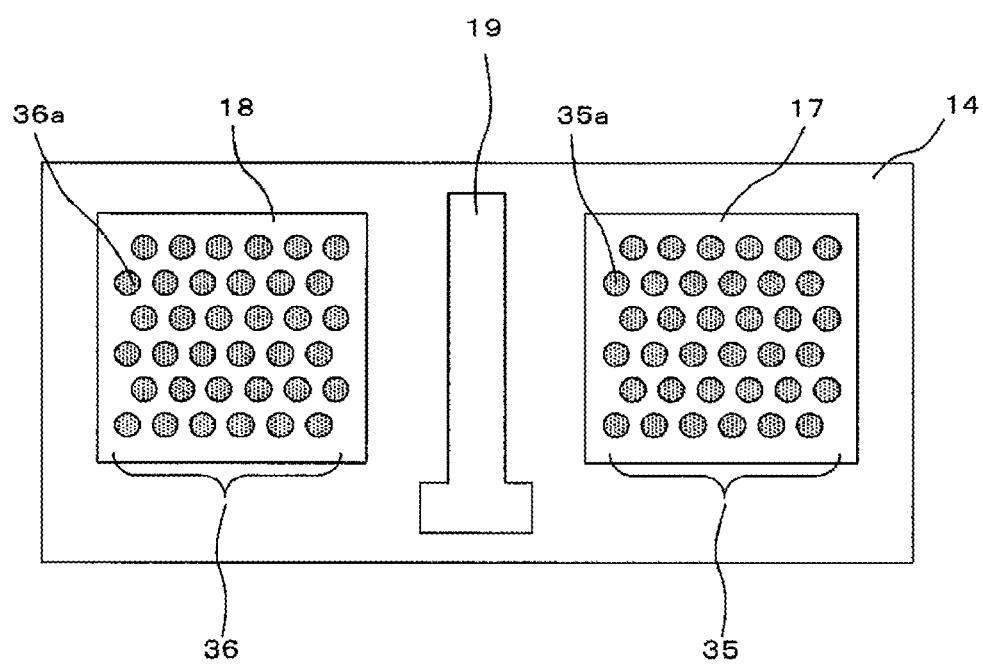
FIG. 7 is a diagram illustrating an example of shapes of groove portions of the semiconductor device illustrated in FIGS. 6A and 6B.
Figure 8A:
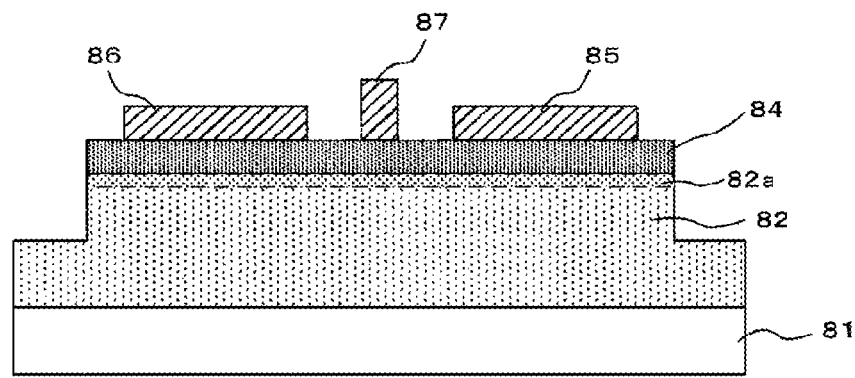
FIGS. 8A and 8B are cross-sectional diagrams illustrating a structure of a semiconductor device in the related art.
Figure 8B:
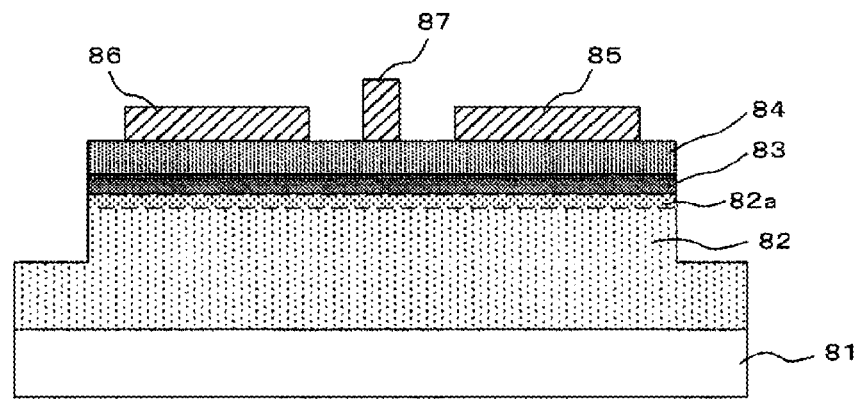

As illustrated in a plan diagram of FIG. 6A and a cross-sectional diagram of FIG. 6B, a semiconductor device 3 also has an HEMT structure similarly to the semiconductor devices 1 and 2 disclosed in the first and second examples. The shapes of the groove portions 35 and 36 in the example are illustrated in FIG. 7. In FIG. 7, the portions of the drain and source electrodes 17 and 18 on a barrier layer 14 are removed in illustration. FIG. 7 is a plan diagram illustrating the shapes of openings of grooves 35a and 36a exposed from the barrier layer 14. In the example, the shape of the openings of the grooves 35a and 36a are circular. The groove portions 35 and 36 are configured so that a plurality of the grooves is arranged in two directions of the width direction of the electrode and the direction perpendicular to the width direction. In addition, as illustrated in FIG. 6B, each of the grooves 35a and 36a penetrates through the barrier layer 14 and the spacer layer 13 and reaches the two-dimensional electron gas layer 12a.

In this manner, the plurality of the grooves of which the shapes of openings are circular are arranged in the two direction, and electrode portions are buried in the grooves, so that it is possible to secure a sufficient contact area between each electrode and the two-dimensional electron gas layer 12a. Therefore, in the example, it is also possible to reduce ohmic resistance of the electrodes.

As described heretofore, in any one of the above-described examples, in the semiconductor device having an HEMT structure, the ohmic electrodes and the two-dimensional electron gas layer are in direct contact with each other, and a sufficient contact area between each ohmic electrode and the two-dimensional electron gas layer is secured. Therefore, it is possible to obtain the semiconductor device having an HEMT structure where the ohmic resistance of the electrodes is reduced.

While several examples are described, the examples are provided as exemplary ones, but the examples are not intended to limit the scope of the invention. These novel examples can be carried out in various other forms, and various omissions, substitutions, and changes are available within the scope without departing from the spirit of the invention. These examples and modifications thereof are included within the scope and spirit of the invention and also included within the scope of the invention disclosed in the claims and the scope of its equivalents.

What is claimed is:

1. A semiconductor device comprising:
   a substrate;
   a semiconductor layer having a buffer layer, a spacer layer, and a barrier layer sequentially stacked on the substrate; and
   first and second ohmic electrodes installed on an upper surface of the barrier layer to be separated from each other; and
   a third electrode installed between the first and second ohmic electrodes on the upper surface of the barrier layer,
   wherein each of the first and second ohmic electrodes includes:
   a portion formed on the upper surface of the barrier layer; and
   electrode portions filling a plurality of grooves penetrating from the upper surface of the barrier layer through the barrier layer and the spacer layer and reaching a region of a two-dimensional electron gas layer formed in a spacer-layer side of the buffer layer, the electrode portions being in contact with side walls of each of the plurality of the grooves,
   wherein the portion and the electrode portions are integrally formed,
   wherein a shape of an opening of each of the plurality of the grooves is rectangular,
   wherein the plurality of the grooves are arranged in a direction perpendicular to a longitudinal direction of the opening of each of the grooves,
   wherein the longitudinal direction of the opening of each of the grooves is perpendicular to an extending direction of the third electrode, and
   wherein both long sides of the opening of each of the plurality of the grooves are formed in a saw teeth shape.

2. The semiconductor device according to claim 1, wherein the first ohmic electrode is a source electrode, the second ohmic electrode is a drain electrode, and the third electrode is a gate electrode.

* * * * *